United States Patent
Ranish (10) Patent No.: US 10,409,306 B2
(45) Date of Patent: Sep. 10, 2019

(54) APPARATUS AND METHODS FOR LOW TEMPERATURE MEASUREMENT IN A WAFER PROCESSING SYSTEM

(71) Applicant: Applied Materials, Inc., Santa Clara, CA (US)

(72) Inventor: Joseph M. Ranish, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 908 days.

(21) Appl. No.: 14/248,935

(22) Filed: Apr. 9, 2014

(65) Prior Publication Data
US 2014/0330422 A1 Nov. 6, 2014

Related U.S. Application Data

(60) Provisional application No. 61/818,338, filed on May 1, 2013.

(51) Int. Cl.
G05D 23/19 (2006.01)
G05D 23/27 (2006.01)
H01L 21/67 (2006.01)

(52) U.S. Cl.
CPC ........ *G05D 23/27* (2013.01); *H01L 21/67115* (2013.01); *H01L 21/67248* (2013.01)

(58) Field of Classification Search
USPC .................. 118/715–732; 156/345.1–345.55
See application file for complete search history.

(56) References Cited

U.S. PATENT DOCUMENTS 4,804,633 A 2/1989 Macelwee et al.
6,047,107 A * 4/2000 Roozeboom ...... H01L 21/67115
118/724

(Continued)

FOREIGN PATENT DOCUMENTS

CN 101253612 A 8/2008
JP 2006093218 A 4/2006

OTHER PUBLICATIONS

International Search Report and Written Opinion for International Application No. PCT/US2014/033534 dated Aug. 18, 2014.

(Continued)

*Primary Examiner* — Karla A Moore
*Assistant Examiner* — Tiffany Z Nuckols
(74) *Attorney, Agent, or Firm* — Patterson + Sheridan LLP (57) ABSTRACT

Implementations disclosed herein relate to methods and apparatus for zoned temperature control during a film forming process. In one implementation, a substrate processing apparatus is provided. The substrate processing apparatus comprises a vacuum chamber, a plurality of power supplies coupled with the plurality of thermal laps and a controller that adjusts the power supplies based on input from radiation sensors. The chamber includes a sidewall defining a processing region. A plurality of thermal lamps is positioned external to the processing region. A window is positioned between the plurality of thermal lamps and the processing region. A radiation source is disposed within the sidewall and oriented to direct radiation toward an area proximate a substrate support. A radiation sensor is disposed on the side of the substrate support opposite the plurality of thermal lamps to receive emitted radiation from the radiation source.

18 Claims, 4 Drawing Sheets

(56) References Cited

U.S. PATENT DOCUMENTS

| | | | |
|---|---|---|---|
| 6,310,328 B1 * | 10/2001 | Gat | H01L 21/67115 118/725 |
| 6,576,565 B1 * | 6/2003 | Chakravarti | C23C 16/045 118/724 |
| 7,112,763 B2 | 9/2006 | Hunter et al. | |
| 7,509,035 B2 | 3/2009 | Ranish et al. | |
| 8,111,978 B2 | 2/2012 | Sorabji et al. | |
| 8,232,503 B2 | 7/2012 | Li et al. | |
| 8,254,767 B2 | 8/2012 | Hunter et al. | |
| 8,283,607 B2 * | 10/2012 | Ranish | H01L 21/67248 118/725 |
| 8,367,983 B2 | 2/2013 | Ranish et al. | |
| 8,582,963 B2 * | 11/2013 | Li | F27B 17/0025 118/728 |
| 8,986,494 B2 * | 3/2015 | Matsudo | G01J 5/0003 118/666 |
| 2002/0066408 A1 | 6/2002 | Anderson | |
| 2002/0192847 A1 | 12/2002 | Ino et al. | |
| 2003/0151733 A1 | 8/2003 | Vatus et al. | |
| 2006/0063280 A1 | 3/2006 | Sohtome | |
| 2006/0086713 A1 | 4/2006 | Hunter et al. | |
| 2006/0289434 A1 * | 12/2006 | Timans | F27B 5/04 219/390 |
| 2009/0102499 A1 | 4/2009 | Segawa et al. | |
| 2009/0160472 A1 | 6/2009 | Segawa et al. | |
| 2009/0289053 A1 * | 11/2009 | Ranish | H01L 21/67115 219/522 |
| 2009/0298300 A1 * | 12/2009 | Ranish | H01L 21/324 438/795 |
| 2010/0074604 A1 * | 3/2010 | Koelmel | H01L 21/67098 392/408 |
| 2010/0124248 A1 * | 5/2010 | Patalay | H01L 21/67248 374/121 |
| 2010/0264132 A1 * | 10/2010 | Koelmel | H01L 21/68 219/647 |
| 2010/0267174 A1 | 10/2010 | Moffatt | |
| 2011/0308453 A1 * | 12/2011 | Su | C23C 16/303 118/708 |
| 2012/0118225 A1 | 5/2012 | Hsu et al. | |
| 2012/0201267 A1 * | 8/2012 | Patalay | G01J 5/0007 374/1 |
| 2012/0227665 A1 | 9/2012 | Ozgun et al. | |

OTHER PUBLICATIONS

Search Report in Chinese Application No. 2014800224180 dated Apr. 20, 2017.

Search Report in Taiwan Application No. 103113567 dated Apr. 8, 2017.

\* cited by examiner

APPARATUS AND METHODS FOR LOW TEMPERATURE MEASUREMENT IN A WAFER PROCESSING SYSTEM

CROSS-REFERENCE TO RELATED APPLICATIONS

This application claims benefit of U.S. Provisional Patent Application Ser. No. 61/818,338, filed May 1, 2013, which is herein incorporated by reference in its entirety.

FIELD

Methods and apparatus for semiconductor processing are disclosed herein. More specifically, implementations disclosed herein relate to methods and apparatus for zoned temperature control during a film forming process.

BACKGROUND

Semiconductor processes such as epitaxy are used extensively in semiconductor processing to form very thin material layers on semiconductor substrates. These layers frequently define some of the smallest features of a semiconductor device, and they may have a high quality crystal structure if the electrical properties of crystalline materials are desired. A deposition precursor is normally provided to a process chamber in which a substrate is disposed; the substrate is heated to a temperature that favors growth of a material layer having desired properties.

It is generally desirable that the film have very uniform thickness, composition, and structure. However, due to variations in local substrate temperature, gas flows, and precursor concentrations, it is quite challenging to form films having uniform and repeatable properties. The process chamber is normally a vessel capable of maintaining vacuum, typically below 10 Torr, and heat is normally provided by heat lamps positioned outside the vessel to avoid introducing contaminants. Control of substrate temperature, and therefore of local layer formation conditions, is complicated by thermal absorptions and emissions of chamber components and exposure of sensors and chamber surfaces to film forming conditions inside the process chamber. There remains a need for a film-forming chamber with improved temperature control, and methods of operating such a chamber to improve uniformity and repeatability.

SUMMARY

Methods and apparatus for semiconductor processing are disclosed herein. More specifically, implementations disclosed herein relate to methods and apparatus for zoned temperature control during a film forming process. In one implementation, a substrate processing apparatus is provided. The substrate processing apparatus comprises a vacuum chamber, a plurality of power supplies coupled with the plurality of thermal laps and a controller that adjusts the power supplies based on input from radiation sensors. The chamber includes a sidewall defining a processing region. A plurality of thermal lamps is positioned external to the processing region. A window is positioned between the plurality of thermal lamps and the processing region. A radiation source is disposed within the sidewall and oriented to direct radiation toward an area proximate a substrate support. A radiation sensor is disposed on the side of the substrate support opposite the plurality of thermal lamps to receive emitted radiation from the radiation source. A reflective member may be positioned to direct radiation from the radiation source disposed within the sidewall toward the radiation sensor. The reflective member may be positioned adjacent the window. The reflective member may be embedded in the window. The reflective member may be sized to fit between adjacent thermal lamps of the plurality of thermal lamps. The radiation sensor disposed within the sidewall may be positioned behind a window. The reflective member may be positioned between two pieces of sealed quartz. The reflective member may be a back surface coated mirror with a protective layer disposed thereon. The window positioned between the plurality of thermal lamps and the processing region may be quartz. The window may be positioned above the sidewall and the plurality of thermal lamps may be positioned above the window. The window may be positioned below the sidewall and the plurality of thermal lamps may be positioned below the window. The window may be a transparent dome.

In another implementation, a method of processing a substrate is provided. The method comprises heating a substrate disposed on a substrate support in a chamber having a window by transmitting radiation from a plurality of lamps through the window. A layer is deposited on the substrate by flowing a precursor gas across the substrate. A first temperature is detected at a first zone of the substrate using a first radiation sensor disposed on a side of the substrate support opposite the plurality of lamps. A second temperature is detected at a second zone of the substrate using a second radiation sensor disposed on the side of the substrate support opposite the plurality of lamps. Power to a first portion of the plurality of lamps is adjusted based on the first temperature. Power to a second portion of the plurality of lamps is adjusted based on the second temperature.

In yet another implementation, a substrate processing apparatus is provided. The substrate processing apparatus comprises a vacuum chamber comprising an upper transparent dome, a lower transparent dome, and a sidewall positioned between the upper transparent dome and the lower transparent dome. A plurality of thermal lamps is positioned proximate to either the upper transparent dome or the lower transparent dome. A radiation source is disposed within the sidewall and oriented to direct radiation toward an area proximate a substrate support. A radiation sensor is disposed on the side of the substrate support opposite the plurality of thermal lamps to receive emitted radiation from the radiation source. A plurality of power supplies is coupled with the plurality of thermal lamps in relation to the position of the radiation sensor. A controller adjusts the plurality of power supplies based on input from the radiation sensor.

BRIEF DESCRIPTION OF THE DRAWINGS

So that the manner in which the above-recited features of the present disclosure can be understood in detail, a more particular description of the disclosure, briefly summarized above, may be had by reference to implementations, some of which are illustrated in the appended drawings. It is to be noted, however, that the appended drawings illustrate only typical implementations of this disclosure and are therefore not to be considered limiting of its scope, for the disclosure may admit to other equally effective implementations.

To facilitate understanding, identical reference numerals have been used, where possible, to designate identical elements that are common to the figures. It is contemplated that elements disclosed in one implementation may be beneficially used on other implementations without specific recitation.

DETAILED DESCRIPTION

As used in this specification and the appended claims, the singular forms "a" and "an" include plural referents unless the context clearly indicates otherwise. Thus, for example, reference to "a radiation source" includes a combination of two or more radiation sources, and the like.

Methods and apparatus for semiconductor processing are disclosed herein. More specifically, implementations disclosed herein relate to methods and apparatus for zoned temperature control in a film forming process. Current temperature measurement systems position pyrometers within a heat source (e.g., a light array) directed toward a substrate. In this position, the pyrometer is affected by light from the light array, which affects the precise measurement of the temperature of the substrate. Some implementations described herein use a temperature control system that performs transmission pyrometry. The temperature control system may include a radiation source and a radiation sensor. The radiation sensor is positioned away from the heat source to provide a more accurate temperature measurement. The radiation sensor may be adapted to measure radiation emitted from the radiation source and through the substrate 108 as well as thermal radiation emitted by the substrate. The radiation source may be positioned in a sidewall of the process chamber. The radiation source may be positioned to direct radiation through the substrate and to the radiation sensor. A reflective member may be used to redirect the radiation emitted by the radiation source from the sidewall of the process chamber through the substrate and to the radiation sensor. The radiation source may be a laser. The reflective member may be semi-transparent so light from the light array is not attenuated.

The temperature control system may include a transmitted radiation detector system to measure radiation transmitted from a radiation source through the substrate at first and second discrete wavelengths and to compare intensity of the transmitted radiation at the first discrete wavelength to the intensity of transmitted radiation at the second discrete wavelength.

In some implementations, the temperature dependence of the bandgap energy of silicon is used to measure temperature. In some implementations, the amount of energy transmitted through a silicon substrate is measured, where the source for the measurement is also the heating element in the chamber. In another implementation, two measurements at two discrete wavelengths are obtained, and the ratio of the measurements is compared. These implementations can minimize variation in transmission unrelated to the bandgap absorption (i.e., dopants, non-spectrally varying films), as well as compensating for source variation. In another embodiment, two discrete wavelength sources (LEDs or lasers) are fired sequentially, and the measurements are compared (for example, by time domain wavelength modulation). In some implementations, rotating apertures may be used to modulate the radiation source signal. These implementations are useful for measuring silicon substrates or thin films in the presence of high background radiation sources.

In some implementations described herein a transmission pyrometer is used to measure temperatures of silicon wafers of less than 500 degrees Celsius and even less than 250 degrees Celsius in a rapid thermal processing chamber. Transmission pyrometers can detect discrete wavelengths of radiation from a light source as it is filtered by a silicon wafer. The absorption of the silicon in some wavelength bands strongly depends upon the wafer temperature and purity. The temperature measurement may be used for thermal processing at no more than such temperatures or may be used to control the pre-heating up to the point that a radiation pyrometer can measure the wafer temperature, for example, at 400 to 500 degrees Celsius.

A low-temperature transmission pyrometer useful below about 350 degrees Celsius may be implemented with a silicon photodiode with little or no filtering in the wavelength band between 1 and 1.2 μm. A transmission pyrometer useful in a wavelength range extending to 500 degrees Celsius includes an InGaAs diode photodetector and a filter blocking radiation above about 1.2 μm. Radiation and transmission pyrometers may be integrated into a structure including an optical splitter receiving radiation from a light pipe or other optical light guide and dividing the radiation into respective beams directed at the transmission pyrometer and the filter of the radiation pyrometer.

Figure 1:
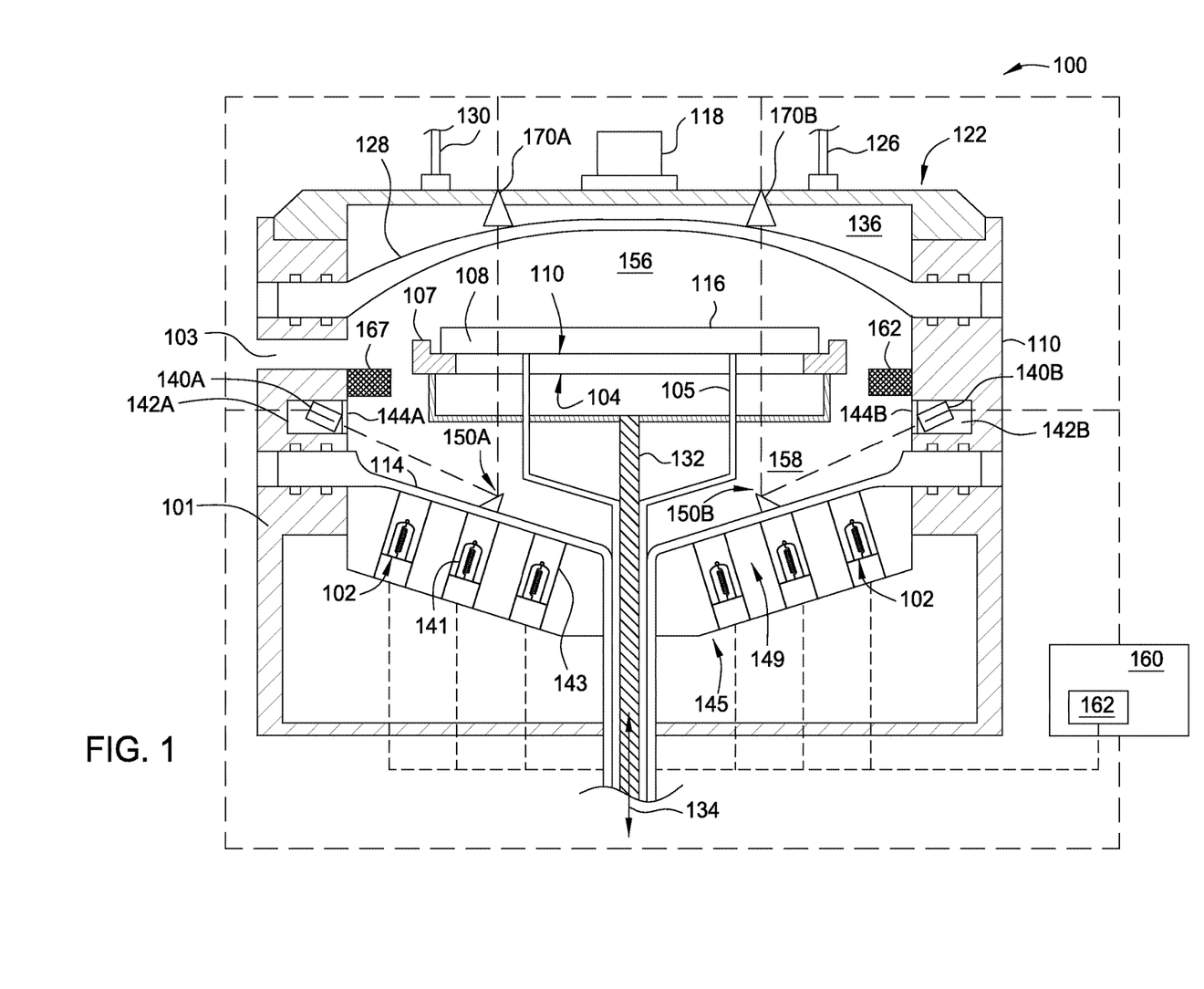
FIG. 1 is a schematic cross-sectional view of a process chamber including a temperature control system according to some implementations described herein.

FIG. 1 is a schematic cross-sectional view of a process chamber 100 including a temperature control system according to one implementation described herein. The temperature control system comprises a radiation source 140a, 140b (collectively 140), a radiation sensor 170a, 170b (collectively 170), and optionally, a reflective member 150a, 150b (collectively 150). The radiation source 140 is disposed in a sidewall 110 defining a processing or process gas region 156 of the process chamber 100 FIG. 1. The radiation sensors 170 are positioned above a substrate support 107 whereas radiant heating lamps 102 are positioned below the substrate support 107.

The process chamber 100 may be used to process one or more substrates, including the deposition of a material on an upper surface of a substrate 108. The process chamber 100 generally includes an array of radiant heating lamps 102 for heating, among other components, a backside 104 of a substrate support 107 disposed within the process chamber 100. The substrate support 107 may be a ring-like substrate support as shown, which supports the substrate from the edge of the substrate, a disk-like or platter-like substrate support, or a plurality of pins, for example three pins. The substrate support 107 is located within the process chamber 100 between an upper dome 128 and a lower dome 114. The substrate 108 (not to scale) can be brought into the process chamber 100 and positioned onto the substrate support 107 through a loading port 103.

The substrate support 107 is shown in an elevated processing position, but may be vertically traversed by an actuator (not shown) to a loading position below the processing position to allow lift pins 105 to contact the lower dome 114, passing through holes in the substrate support 107, and raise the substrate 108 from the substrate support 107. A robot (not shown) may then enter the process chamber 100 to engage and remove the substrate 108 therefrom though the loading port 103. The substrate support 107 then may be actuated up to the processing position to place the substrate 108, with its device side 116 facing up, on a front side 110 of the substrate support 107.

The substrate support 107, while located in the processing position, divides the internal volume of the process chamber 100 into the processing or process gas region 156 (above the substrate) and a purge gas region 158 (below the substrate support 107). The substrate support 107 is rotated during processing by a central shaft 132 to minimize the effect of thermal and process gas flow spatial anomalies within the process chamber 100 and thus facilitate uniform processing of the substrate 108. The substrate support 107 is supported by the central shaft 132, which moves the substrate 108 in an up and down direction 134 during loading and unloading, and in some instances, processing of the substrate 108. The substrate support 107 is typically formed from a material having low thermal mass or low heat capacity, so that energy absorbed and emitted by the substrate support 107 is minimized. The substrate support 107 may be formed from silicon carbide or graphite coated with silicon carbide to absorb radiant energy from the lamps 102 and conduct the radiant energy to the substrate 108. The substrate support 107 is shown in FIG. 1 as a ring with a central opening to facilitate exposure of the substrate to the thermal radiation from the lamps 102. The substrate support 107 may also be a platter-like member with no central opening. In some implementations, the substrate support 107 may have apertures or windowed apertures for transmission of the radiation emitted by the radiation source 140.

In general, the upper dome 128 and the lower dome 114 are typically formed from an optically transparent material such as quartz. The upper dome 128 and the lower dome 114 are thin to minimize thermal memory, typically having a thickness between about 3 mm and about 10 mm, for example about 4 mm. The upper dome 128 may be thermally controlled by introducing a thermal control fluid, such as a cooling gas, through an inlet portal 126 into a thermal control space 136 and withdrawing the thermal control fluid through an exit portal 130. In some implementations, a cooling fluid circulating through the thermal control space 136 may reduce deposition on an inner surface of the upper dome 128.

One or more lamps, such as an array of lamps 102, can be disposed adjacent to and beneath the lower dome 114 in a specified, optimal desired manner around the central shaft 132 to heat the substrate 108 as the process gas passes over, thereby facilitating the deposition of a material onto the upper surface of the substrate 108. In various examples, the material deposited onto the substrate 108 may be a group III, group IV, and/or group V material, or may be a material including a group III, group IV, and/or group V dopant. For example, the deposited material may include gallium arsenide, gallium nitride, or aluminum gallium nitride.

The lamps 102 may be adapted to heat the substrate 108 to a temperature within a range of about 200 degrees Celsius to about 1,200 degrees Celsius, such as a temperature within a range of about 300 degrees Celsius to about 950 degrees Celsius. The lamps 102 may include bulbs 141 surrounded by an optional reflector 143. Each lamp 102 is coupled to a power distribution board (not shown) through which power is supplied to each lamp 102. The lamps 102 are positioned within a lamphead 145, which may be cooled during or after processing by, for example, a cooling fluid introduced into channels 149 located between the lamps 102. The lamphead 145 conductively cools the lower dome 114 due in part to the close proximity of the lamphead 145 to the lower dome 114. The lamphead 145 may also cool the lamp walls and walls of the reflectors 143. If desired, the lamphead(s) 145 may or may not be in contact with the lower dome 114.

A circular shield 167 may be optionally disposed around the substrate support 107 and coupled to the sidewall 110 of the chamber body 101. The shield 167 prevents or minimizes leakage of heat/light noise from the lamps 102 to the device side 116 of the substrate 108 in addition to providing a pre-heat zone for the process gases. The shield 167 may be made from CVD SiC coated sintered graphite, grown SiC, or a similar opaque material that is resistant to chemical breakdown by process and cleaning gases.

A reflector 122 may be optionally placed outside the upper dome 128 to reflect infrared light that is radiating off the substrate 108 back onto the substrate 108. Due to the reflected infrared light, the efficiency of the heating will be improved by containing heat that could otherwise escape the process chamber 100. The reflector 122 can be made of a metal such as aluminum or stainless steel. The process chamber 100 can have machined channels to carry a flow of a fluid such as water for cooling the reflector 122. If desired, the efficiency of the reflection can be improved by coating a reflector area with a highly reflective coating such as with gold.

The temperature control system comprises radiation sources 140a, 140b, radiation sensors 170a, 170b, and optionally, the reflective members 150a, 150b. The radiation sources 140a, 140b may be optical sources. The radiation sensors 170a, 170b may be optical sensors. Exemplary radiation sources include lasers, light emitting diodes (LEDs), low power incandescent bulb or other suitable light sources. The temperature control systems may comprise radiation pyrometer systems and/or transmission pyrometer systems.

The radiation sources 140a, 140b are typically disposed at different locations in the sidewall 110 to facilitate viewing different locations of the substrate 108 during processing. The radiation sources 140a, 140b may be positioned in apertures 142a, 142b formed in the sidewall 110. In some implementations, the radiation sources 140a, 140b are exposed to the environment of the process chamber 100. In some implementations where the radiation sources 140a, 140b are exposed to the environment of the process chamber 100, the radiation sources 140a, 140b may be coated with a protective coating layer to protect the radiation sources 140a, 140b from processing chemistries used in the process chamber 100. In some implementations, the radiation sources 140a, 140b are isolated from the environment of the process chamber 100. The radiation sources 140a, 140b may be isolated from the environment of the process chamber 100 by windows 144a, 144b (collectively 144). The windows 144a, 144b are positioned over the apertures 142a, 142b. The windows 144a, 144b may be selected such that the material of the windows 144a, 144b is transmissive to the radiation emitted by the radiation sources 140a, 140b but reflective to the radiation emitted by the radiant heating lamps. Exemplary materials for the material of the windows 144a, 144b include quartz, sapphire, tantalum, tantala ($Ta_2O_5$—$SiO_2$), titania ($TiO_2$—$SiO_2$), silica ($SiO_2$), zinc, niobia and combinations thereof. In some implementations, the windows 144a, 144b may be coated with a dielectric coating that is selective to the wavelength of the radiation sources 140a, 140b.

In some implementations, the radiation sources 140a, 140b may be provided with cooling to protect the radiation sources 140a, 140b from overheating. Cooling for the radiation sources 140a, 140b may be provided by any suitable cooling sources or mechanisms. Exemplary cooling sources and mechanisms include both active and passing cooling sources (e.g., cooling fluids, chill plates or housing, thermoelectric coolers (TEC or Peltier), and/or reflective housings.

A plurality of radiation sensors 170a, 170b for measuring radiation emitted from the radiation source 140a, 140b and through the substrate 108 as well as thermal radiation emitted by the substrate 108 are positioned on the side of the substrate support 107 opposite the radiant heating lamps 102. The sensors 170 are typically disposed at different locations to facilitate viewing different locations of the substrate 108 during processing. In some implementations, the sensors 170 are disposed outside of the process chamber 100, for example, above the upper dome 128. In some implementations, the radiation sensors 170a, 170b are disposed within the process chamber 100, for example, within the process gas region 156. In some implementations, the sensors 170 may be embedded within the upper dome 128.

Sensing transmitted radiation from different locations of the substrate 108 facilitates comparing the thermal energy content, for example the temperature, at different locations of the substrate 108 to determine whether temperature anomalies or non-uniformities are present. Such non-uniformities can result in non-uniformities in film formation, such as thickness and composition. The number of radiation sensors 170a, 170b typically corresponds to the number of radiation sources 140a, 140b. At least one sensor 170a, 170b is used, but more than one may be used. Different implementations may use two, three, four, five, six, seven, or more sensors 170.

Each sensor 170 views a zone of the substrate 108 and senses the transmitted radiation to determine the thermal state of a zone of the substrate. The zones may be oriented radially in some implementations. For example, in implementations where the substrate 108 is rotated, the sensors 170 may view, or define, a central zone in a central portion of the substrate 108 having a center substantially the same as the center of the substrate 108, with one or more zones surrounding the central zone and concentric therewith. It is not required that the zones be concentric and radially oriented, however. In some implementations, zones may be arranged at different locations of the substrate 108 in non-radial fashion.

The sensors 170 may be attuned to the same wavelength or spectrum, or to different wavelengths or spectra. For example, substrates used in the chamber 100 may be compositionally homogeneous, or they may have domains of different compositions. Using sensors 170 attuned to different wavelengths may allow monitoring of substrate domains having different composition and different emission responses to thermal energy.

In certain implementations, the reflective members 150a, 150b are positioned in the process chamber 100 to direct radiation from the radiation source 140a, 140b through the substrate 108 and toward the radiation sensors 170. Each radiation sensor 170 may have a corresponding reflective member 150. The number of reflective members 150 in the process chamber 100 may be the same as, less than, or greater than the number of thermal radiation sensors 170. In certain implementations, each reflective member 150 may be positioned to reflect the greatest amount of emitted radiation toward the reflective member's corresponding sensor 170.

The reflective members 150a, 150b comprise materials that are reflective to the radiation emitted by the radiation sources 140a, 140b. The reflective members 150a, 150b may comprise materials that are transparent to the radiation emitted by the radiant heating lamps 102.

In certain implementations, the reflective members 150a, 150b are positioned on the same side of the substrate support 107 as the radiation sources 140a, 140b. The reflective members 150a, 150b may be positioned at the bottom of the process chamber 100. The reflective members 150a, 150b may be positioned adjacent to the lower dome 114. The reflective members 150a, 150b may be positioned on the lower dome 114. The reflective members 150a, 150b may be embedded in the lower dome 114. The reflective members 150a, 150b may be disposed between the radiant heating lamps 102, for example in the channels 149. In certain implementations, where the reflective members 150a, 150b are transmissive to the radiant energy emitted by the radiant heating lamps 102 but reflective to the radiation emitted by the radiation sources 140a, 140b, the reflective members 150a, 150b may be positioned over the lamphead 145.

In certain implementations, the reflective members 150a, 150b are encapsulated in quartz. The quartz may be sealed. In certain implementations, the reflective members 150a, 150b are mirrors with a back surface coated with a protective layer.

In some implementations where the reflective members 150a, 150b are exposed to the environment of the process chamber 100, the reflective members 150a, 150b may be coated with a protective coating layer to protect the reflective members 150a, 150b from processing chemistries used in the process chamber 100.

In some implementations, the reflective members 150a, 150b may be provided with cooling to protect the reflective members 150a, 150b from overheating. Cooling for the reflective members 150a, 150b may be provided by any suitable cooling sources or mechanisms. Exemplary cooling sources and mechanisms include both active and passing cooling sources (e.g., cooling fluids, chill plates or housings, thermoelectric coolers (TEC or Peltier), and/or reflective housings.

In certain implementations, the reflective members 150 are oriented to provide the reflected beam substantially normal to the substrate 108. In some implementations, the reflective members 150 are oriented to provide the reflected beam normal to the substrate 108, while in other implementations, the reflective members 150 may be oriented to provide the reflected beam in slight departure from normality. An orientation angled within about 5° of normal is most frequently used.

A top thermal sensor 118 may be disposed in the reflector 122 to monitor a thermal state of the upper dome 128 and/or substrate 108. Such monitoring may be useful to compare to data received from the radiation sensors 170a, 170b, for example to determine whether a fault exists in the data received from the radiation sensors 170a, 170b. The top thermal sensor 118 may be an assembly of sensors in some cases, featuring more than one individual sensor. Thus, the chamber 100 may feature one or more sensors disposed to receive radiation emitted from a first side of a substrate and one or more sensors disposed to receive radiation from a second side of the substrate opposite the first side.

A controller 160 receives data from the sensors 170 and separately adjusts power delivered to each lamp 102, or individual groups of lamps or lamp zones, based on the data. The controller 160 may include a power supply 162 that independently powers the various lamps or lamp zones. The controller 160 can be configured with a desired temperature profile, and based on comparing the data received from the sensors 170; the controller 160 adjusts power to lamps and/or lamp zones to conform the observed thermal data to the desired temperature profile. The controller 160 may also adjust power to the lamps and/or lamp zones to conform the thermal treatment of one substrate to the thermal treatment of another substrate, in the event some chamber characteristics drift over time.

Figure 2:
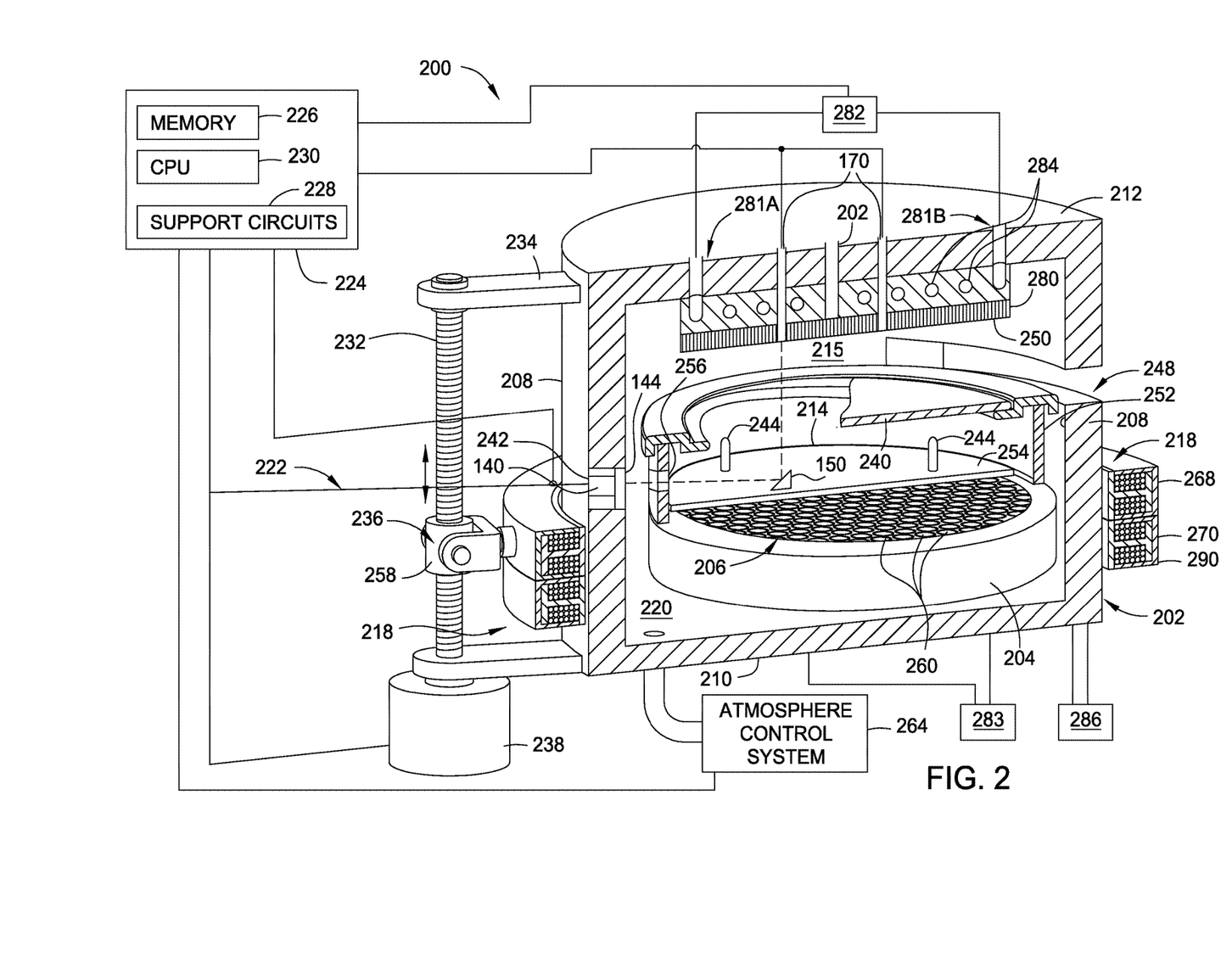
FIG. 2 is a simplified isometric view of one implementation of a rapid thermal process chamber (RTP) including another temperature control system according to some implementations described herein.

FIG. 2 is a simplified isometric view of one implementation of a rapid thermal process chamber (RTP) 200 including another temperature control system according to one implementation described herein. Similar to the temperature control system depicted in FIG. 1, the temperature control system of FIG. 2 comprises a radiation source 140, a radiation sensor 170, and optionally a reflective member 150.

The process chamber 200 includes a substrate support 204, a chamber body 202, having sidewalls 208, a bottom 210, and a top 212 defining an interior volume 220. A processing region 215 is defined between the sidewalls 208, the substrate support 204 and the top 212. The sidewalls 208 typically include at least one substrate access port 248 to facilitate entry and egress of a substrate 240 (a portion of which is shown in FIG. 2). The access port may be coupled to a transfer chamber (not shown) or a load lock chamber (not shown) and may be selectively sealed with a valve, such as a slit valve (not shown).

In one implementation, the substrate support 204 is annular and the chamber 200 includes a radiant heat source 206 disposed in an inside diameter of the substrate support 204. The substrate support 204 comprises an annular sidewall 252 with a substrate support ring 254 disposed thereon for supporting substrate 240. The radiant heat source 206 typically comprises a plurality of lamps. Exemplary RTP chambers and methods of pyrometry that may be used with the implementations described herein are described in U.S. Pat. Nos. 7,112,763, 8,254,767, and United States Patent Application Publication No. 2005/0191044.

In one implementation, the chamber 200 includes a plate 250 incorporating gas distribution outlets to distribute gas evenly over a substrate to allow rapid and controlled heating and cooling of the substrate. The plate 250 may be absorptive, reflective, or have a combination of absorptive and reflective regions. In one implementation, the plate 250 may have regions, some within view of the radiation sensors 170, and some outside the view of the pyrometers. The regions within view of the radiation sensors 170 may be about one inch in diameter, if circular, or other shape and size as necessary. The regions within view of the radiation sensors 170 may be very highly reflective over the wavelength ranges observed by the radiation sensors 170. Outside the wavelength range and field of view of the radiation sensors 170, the plate 250 can range from reflective to minimize radiative heat loss, to absorptive to maximize radiative heat loss to allow for shorter thermal exposure.

The radiation source 140 may be disposed in the sidewall 208 of the process chamber 200. In some implementations where multiple radiation sources are used, the radiation sources 140 are typically disposed at different locations in the sidewall 208 to facilitate viewing different locations of a substrate 240 during processing. The radiation source 140 may be positioned in an aperture 242 formed in the sidewall 208. In some implementations, the radiation source 140 is exposed to the processing environment of the process chamber 200. In some implementations where the radiation source 140 is exposed to the environment of the process chamber 200, the radiation source 140 may be coated with a protective coating layer to protect the radiation source 140 from processing chemistries used in the process chamber 100. In some implementations, the radiation source 140 is isolated from the environment of the process chamber 100. The radiation source 140 may be isolated from the environment of the process chamber 200 by a window 144 placed over aperture 242. In some implementations, the radiation source 140 may be provided with cooling to protect the radiation source 140 from overheating as previously described herein.

The annular sidewall 252 of the substrate support 204 may also have an aperture with a window 256 disposed therein for allowing the beam from the radiation source 140 to reach the reflective member 150. The window 256 may comprise any of the materials described above for window 144.

In certain implementations, the reflective member 150 is positioned in the process chamber 100 to direct radiation from the radiation source 140 through the substrate 240 and toward the radiation sensors 170. As described above, each radiation sensor 140 may have a corresponding reflective member 150. The number of reflective members 150 in the process chamber 200 may be the same as, less than, or greater than the number of radiation sensors 170. In certain implementations, each reflective member 150 may be positioned to reflect the greatest amount of emitted radiation toward the reflective member's corresponding radiation sensor 170.

In certain implementations, the reflective member 150 is positioned on the same side of the substrate support 204 as the radiation source 140. The reflective member 150 may be positioned at the bottom of the process chamber 200. The reflective member 150 may be positioned adjacent to the window 214. The reflective member 150 may be positioned on the window 214. The reflective member 150 may be embedded in the window 214. The reflective member 150 may be disposed between the honeycomb tubes 260 of the radiant heat source 206. In certain implementations, the reflective member 150 may be positioned over the honeycomb tubes 260 of the radiant heat source 206.

The RTP chamber 200 also includes a cooling block 280 adjacent to, coupled to, or formed in the top 212. Generally, the cooling block 280 is spaced apart and opposing the radiant heat source 206. The cooling block 280 comprises one or more coolant channels 284 coupled to an inlet 281A and an outlet 281B. The cooling block 280 may be made of a process resistant material, such as stainless steel, aluminum, a polymer, or a ceramic material. The coolant channels 284 may comprise a spiral pattern, a rectangular pattern, a circular pattern, or combinations thereof and the channels 284 may be formed integrally within the cooling block 280, for example by casting the cooling block 280 and/or fabricating the cooling block 280 from two or more pieces and joining the pieces. Additionally or alternatively, the coolant channels 284 may be drilled into the cooling block 280.

The inlet 281A and outlet 281B may be coupled to a coolant source 282 by valves and suitable plumbing and the coolant source 282 is in communication with the controller 224 to facilitate control of pressure and/or flow of a fluid disposed therein. The fluid may be water, ethylene glycol, nitrogen ($N_2$), helium (He), or other fluid used as a heat-exchange medium.

In the implementation shown, the substrate support 204 is optionally adapted to magnetically levitate and rotate within the interior volume 220. The substrate support 204 shown is capable of rotating while raising and lowering vertically during processing, and may also be raised or lowered without rotation before, during, or after processing. This magnetic levitation and/or magnetic rotation prevents or minimizes particle generation due to the absence or reduction of moving parts typically required to raise/lower and/or rotate the substrate support.

The chamber 200 also includes a window 214 made from a material transparent to heat and light of various wavelengths, which may include light in the infra-red (IR) spectrum, through which photons from the radiant heat source 206 may heat the substrate 240. In one implementation, the window 214 is made of a quartz material, although other materials that are transparent to light maybe used, such as sapphire. In one implementation, the window 214 is selected such that the material of the window 214 is transmissive to the radiation emitted by the radiant heat source 206 but reflective to the radiation emitted by the radiation source 140. The window 214 may also include a plurality of lift pins 244 coupled to an upper surface of the window 214, which are adapted to selectively contact and support the substrate 240, to facilitate transfer of the substrate into and out of the chamber 200. Each of the plurality of lift pins 244 are configured to minimize absorption of energy from the radiant heat source 206 and may be made from the same material used for the window 214, such as a quartz material. The plurality of lift pins 244 may be positioned and radially spaced from each other to facilitate passage of an end effector coupled to a transfer robot (not shown). Alternatively, the end effector and/or robot may be capable of horizontal and vertical movement to facilitate transfer of the substrate 240.

In one implementation, the radiant heat source 206 includes a lamp assembly formed from a housing, which includes a plurality of honeycomb tubes 260 in a coolant assembly (not shown) coupled to a second coolant source 283. The second coolant source 283 may be one or a combination of water, ethylene glycol, nitrogen ($N_2$), and helium (He). The housing walls 208, 210 may be made of a copper material or other suitable material having suitable coolant channels formed therein for flow of the coolant from the second coolant source 283. The coolant cools the housing of the chamber 200 so that the housing is cooler than the substrate 240. Each tube 260 may contain a reflector and a high-intensity lamp assembly or an IR emitter from which is formed a honeycomb like pipe arrangement. This close-packed hexagonal arrangement of pipes provides radiant energy sources with high power density and good spatial resolution. In one implementation, the radiant heat source 206 provides sufficient radiant energy to thermally process the substrate, for example, annealing a silicon layer disposed on the substrate 240. The radiant heat source 206 may further comprise annular zones, wherein the voltage supplied to the plurality of tubes 260 by controller 224 may be varied to enhance the radial distribution of energy from the tubes 260.

Dynamic control of the heating of the substrate 240 may be affected by the one or more radiation sensors 170 adapted to measure the temperature across the substrate 240.

In the implementation shown, an optional stator assembly 218 circumscribes the walls 208 of the chamber body 202 and is coupled to one or more actuator assemblies 222 that control the elevation of the stator assembly 218 along the exterior of the chamber body 202. In one implementation (not shown), the chamber 200 includes three actuator assemblies 222 disposed radially about the chamber body, for example, at about 120 degree angles about the chamber body 202. The stator assembly 218 is magnetically coupled to the substrate support 204 disposed within the interior volume 220 of the chamber body 202. The substrate support 204 may comprise or include a magnetic portion to function as a rotor, thus creating a magnetic bearing assembly to lift and/or rotate the substrate support 204. In one implementation, at least a portion of the substrate support 204 is partially surrounded by a trough (not shown) that is coupled to a fluid source 286, which may include water, ethylene glycol, nitrogen ($N_2$), helium (He), or combinations thereof, adapted as a heat exchange medium for the substrate support. The stator assembly 218 may also include a housing 290 to enclose various parts and components of the stator assembly 218. In one implementation, the stator assembly 218 includes a drive coil assembly 268 stacked on a suspension coil assembly 270. The drive coil assembly 268 is adapted to rotate and/or raise/lower the substrate support 204 while the suspension coil assembly 270 may be adapted to passively center the substrate support 204 within the process chamber 200. Alternatively, the rotational and centering functions may be performed by a stator having a single coil assembly.

An atmosphere control system 264 is also coupled to the interior volume 220 of the chamber body 202. The atmosphere control system 264 generally includes throttle valves and vacuum pumps for controlling chamber pressure. The atmosphere control system 264 may additionally include gas sources for providing process or other gases to the interior volume 220. The atmosphere control system 264 may also be adapted to deliver process gases for thermal deposition processes, thermal etch processes, and in-situ cleaning of chamber components. The atmosphere control system 264 works in conjunction with the showerhead gas delivery system.

The process chamber 200 also includes a controller 224, which generally includes a central processing unit (CPU) 230, support circuits 228 and memory 226. The CPU 230 may be one of any form of computer processor that can be used in an industrial setting for controlling various actions and sub-processors. The memory 226, or computer-readable medium, may be one or more of readily available memory such as random access memory (RAM), read only memory (ROM), floppy disk, hard disk, or any other form of digital storage, local or remote, and is typically coupled to the CPU 230. The support circuits 228 are coupled to the CPU 230 for supporting the controller 224 in a conventional manner. These circuits include cache, power supplies, clock circuits, input/output circuitry, subsystems, and the like.

In one implementation, each of the actuator assemblies 222 generally comprise a precision lead screw 232 coupled between two flanges 234 extending from the walls 208 of the chamber body 202. The lead screw 232 has a nut 258 that axially travels along the lead screw 232 as the screw rotates. A coupling 236 is coupled between the stator 218 and the nut 258 so that as the lead screw 232 is rotated, the coupling 236 is moved along the lead screw 232 to control the elevation of the stator 218 at the interface with the coupling 236. Thus, as the lead screw 232 of one of the actuators 222 is rotated to produce relative displacement between the nuts 258 of the other actuators 222, the horizontal plane of the stator 218 changes relative to a central axis of the chamber body 202.

In one implementation, a motor 238, such as a stepper or servo motor, is coupled to the lead screw 232 to provide controllable rotation in response to a signal by the controller 224. Alternatively, other types of actuators 222 may be utilized to control the linear position of the stator 218, such as pneumatic cylinders, hydraulic cylinders, ball screws, solenoids, linear actuators and cam followers, among others.

The process chamber 200 also includes one or more radiation sensors 170, which may be adapted to sense radiation emitted from the radiation source 140 and through the substrate 240 as well as thermal radiation emitted by the substrate 240 before, during, and after processing. In the implementation depicted in FIG. 2, the radiation sensors 170 are disposed through the top 212, although other locations within and around the chamber body 202 may be used. The radiation sensors 170 may be adapted to couple to the top 212 in a configuration to sense the entire diameter of the substrate, or a portion of the substrate. The radiation sensors 170 may comprise a pattern defining a sensing area substantially equal to the diameter of the substrate 240, or a sensing area substantially equal to the radius of the substrate 240. For example, a plurality of radiation sensors 170 may be coupled to the top 212 in a radial or linear configuration to enable a sensing area across the radius or diameter of the substrate 240. In one implementation (not shown), a plurality of radiation sensors 170 may be disposed in a line extending radially from about the center of the top 212 to a peripheral portion of the top 212. In this manner, the radius of the substrate 240 may be monitored by the radiation sensors 170, which will enable sensing of the diameter of the substrate 240 during rotation.

As described herein, the chamber 200 is adapted to receive a substrate in a "face-up" orientation, wherein the deposit receiving side or face of the substrate is oriented toward the plate 250 and the "backside" of the substrate is facing the radiant heat source 206. The "face-up" orientation may allow the energy from the radiant heat source 206 to be absorbed more rapidly by the substrate 240 as the backside of the substrate may be less reflective than the face of the substrate.

The controller 224 receives data from the radiation sensors 170 and separately adjusts power delivered to each lamp of the radiant heat source 206, or individual groups of lamps or lamp zones, based on the data. The controller 224 may include a power supply (not shown) that independently powers the various lamps or lamp zones. The controller 224 can be configured with a desired temperature profile, and based on comparing the data received from the sensors 170; the controller 224 adjusts power to lamps and/or lamp zones to conform the observed thermal data to the desired temperature profile. The controller 224 may also adjust power to the lamps and/or lamp zones to conform the thermal treatment of one substrate to the thermal treatment of another substrate, in the event some chamber characteristics drift over time.

The number of radiation sensors 170 typically corresponds to the number of radiation sources 140. Although only one sensor is depicted in FIG. 2, any number of sensors 170 may be used. For example, different implementations may use two, three, four, five, six, seven, or more sensors 170.

Figure 3:
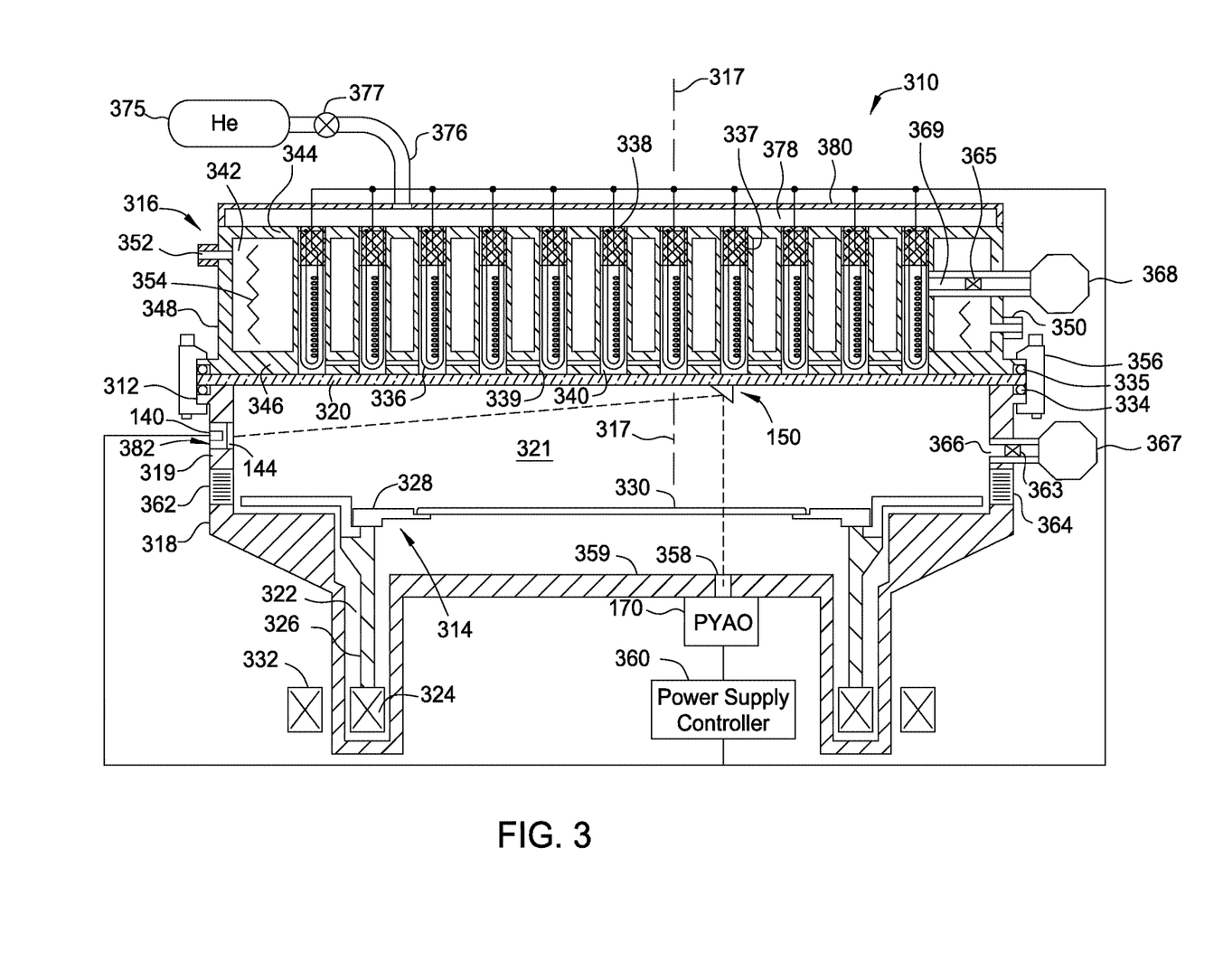
FIG. 3 is a schematic cross-sectional view of another implementation of an RTP chamber including yet another temperature control system according to some implementations described herein.

FIG. 3 is a schematic cross-sectional view of another implementation of an RTP chamber 312 including yet another temperature control system according to implementations described herein. FIG. 3 schematically illustrates in cross section an RTP reactor 310 described by Ranish et al. in U.S. Pat. No. 6,376,804 and is generally representative of the Radiance RTP reactor available from Applied Materials, Inc. of Santa Clara, Calif. The reactor 310 includes a process chamber 312, a substrate support 314 located within chamber 312, and a lamphead or radiant heat source assembly 316 located on the top of the chamber 312, all generally symmetrically arranged about a central axis 317.

Similar to the temperature control systems depicted in FIG. 1 and FIG. 2, the temperature control system of FIG. 3 comprises a radiation source 140, a radiation sensor 170, and optionally a reflective member 150.

The process chamber 312 includes a main body 318 having a sidewall 319 and a window 320 resting on the sidewall 319 of the main body 318. The main body and window define a processing region 321. The window 320 may be made of a material that is transparent to infrared light, for example, clear fused silica quartz. In one implantation, the window 320 is selected such that the material of the window 320 is transmissive to the radiation emitted by the radiant heat source assembly 316 but reflective to the radiation emitted by the radiation source 140.

The main body 318 is made of stainless steel and may be lined with quartz (not shown). A circular channel 322 is formed near the bottom of the main body 318. The substrate support 314 includes a magnetic rotor 324 within the channel 322, a quartz tubular riser 326 resting on or other coupled to the magnetic rotor 324, and a silicon-coated silicon carbide, opaque silicon carbide or graphite edge ring 328 resting on the riser 326. During processing, a substrate 330 or other substrate rests on the edge ring 328. A magnetic stator 332 is located externally of the magnetic rotor 324 and is magnetically coupled through the main body 318 to induce rotation of the magnetic rotor 324 and hence of the edge ring 328 and supported substrate 330 about the central axis 317.

The window 320 rests on an upper edge of the main body 318 and an O-ring 334 located between the window 320 and the main body 318 provides an air-tight seal between them. The radiant heat source assembly 316 overlies the window 320. Another O-ring 335 located between the window 320 and lamphead 316 provides an airtight seal between them. The radiant heat source assembly 316 includes a plurality of lamps 336 that are supported by and electrically powered through electrical sockets 338. The lamps 336 are preferably incandescent bulbs that emit strongly in the infrared such as tungsten halogen bulb having a tungsten filament inside a quartz bulb filled with a gas containing a halogen gas such as bromine and diluted with an inert gas to clean the quartz bulb. Each bulb is potted with a ceramic potting compound 337, which is relatively porous. The lamps 336 are located inside vertically oriented cylindrical lamp holes 339 formed on a reflector body 340. More details of the reflector structure will be provided later. The open ends of the lamp holes 339 of the reflector body 340 are located adjacent to but separated from the window 320.

The radiation source 140 may be disposed in the sidewall 319 of the process chamber 312. In some implementations where multiple radiation sources are used, the radiation sources 140 are typically disposed at different locations in the sidewall 319 to facilitate viewing different locations of the substrate 330 during processing. The radiation source 140 may be positioned in an aperture 382 formed in the sidewall 319. In some implementations, the radiation source 140 is exposed to the environment of the process chamber 312. In some implementations where the radiation source 140 is exposed to the environment of the process chamber 312, the radiation source 140 may be coated with a protective coating layer to protect the radiation source 140 from processing chemistries used in the process chamber 312. In some implementations, the radiation source 140 is isolated from the environment of the process chamber 312. The radiation source 140 may be isolated from the environment of the process chamber 312 by a window 144 positioned over the aperture 382. In some implementations, the radiation source 140 may be provided with cooling to protect the radiation source 140 from overheating as previously described herein.

In certain implementations, the reflective member 150 is positioned in the process chamber 312 to direct radiation from the radiation source 140 through the substrate 330 and toward the radiation sensor 170. Each radiation sensor 140 may have a corresponding reflective member 150. The number of reflective members 150 in the process chamber 100 may be the same as, less than, or greater than the number of radiation sensors 170. In certain implementations, each reflective member 150 may be positioned to reflect the greatest amount of radiation toward the reflective member's corresponding radiation sensor 170.

In certain implementations, the reflective member 150 is positioned on the same side of the substrate support 314 as the radiation sources 140. The reflective member 150 may be positioned at the top of the process chamber 312. The reflective member 150 may be positioned on the window 320. The reflective member 150 may be positioned adjacent to the window 320. The reflective member 150 may be embedded in the window 320. The reflective members 150 may be disposed between the lamp holes 339 of the radiant heat source assembly 316. In certain implementations, the reflective member 150 may be positioned over the lamp holes 339 of the radiant heat source assembly 316.

A cooling chamber 342 is defined within the reflector body 340 by upper and lower chamber walls 344, 346 and a cylindrical wall 348 and surrounds each of the lamp holes 339. A coolant, such as water, introduced into the chamber via an inlet 350 and removed at an outlet 352 cools the reflector body 340 and traveling adjacent the lamp holes 339 cools the lamps 336. Baffles 354 may be included to ensure proper flow of the coolant through the chamber. Clamps 356 secure and seal the window 320, the radiant heat source assembly 316, and the main chamber body 318 to one another.

The radiation sensor 170 may be optically coupled to and disposed adjacent respective apertures 358 in a reflector plate 359 and supported in the main body 318 to detect a temperature or other thermal property of a different radial portion of the lower surface of the substrate 330. The radiation sensor 170 is connected to a power supply controller 360, which controls the power supplied to the infrared lamps 336 in response to the measured temperatures. The infrared lamps 336 may be controlled in radially arranged zones, for example, fifteen zones, to provide a more tailored radial thermal profile to account for thermal edge effects. The radiation sensor 170 provides signals indicative of a temperature profile across the substrate 330 to the power supply controller 360, which controls the power supplied to each of the zones of the infrared lamps 336 in response to a measured temperature. In some implementations, the reactor 310 comprises seven or more radiation sensors 170.

The main body 318 of the process chamber 312 includes a processing gas inlet port 362 and a gas outlet port 364. In operation, the pressure within the process chamber 312 can be reduced to a sub-atmospheric pressure prior to introducing a process gas through the inlet port 362. The process chamber is evacuated by pumping through a port 366 by means of a vacuum pump 367 and a valve 363. The pressure is typically reduced to between about 1 and 160 Torr. Certain processes, however, can be run at atmospheric pressure, though often in the presence of a specified gas and the process chamber does not need to be evacuated for such processes.

Another vacuum pump 368 reduces the pressure within the lamphead 316, particularly when the process chamber 312 is pumped to a reduced pressure to reduce the pressure differential across the window 320. The pressure within the lamphead 316 is reduced by pumping though a port 369 including a valve 365, which extends through the cooling chamber 342 and is in fluid communication with an interior space of the reflector body.

A pressurized source 375 of a thermally conductive gas, such as helium, fills the radiant heat source assembly 316 with the thermally conductive gas to facilitate thermal transfer between the lamps 336 and the cooling channels 342. The pressurized source 375 is connected to the radiant heat source assembly 316 through a port 376 and a valve 377. The thermally conductive gas is introduced into a space 378 formed between a lamphead cover 380 and the base of each lamp 336. Opening the valve 377 causes the gas to flow into this space 378. Since the lamp potting compound 337 is porous, the thermally conductive gas flows through the potting compound 337 and around the walls of each lamp 336 to cool it.

The controller 360 receives data from the radiation sensors 170 and separately adjusts power delivered to each lamp 336 of the radiant heat source assembly 316, or individual groups of lamps or lamp zones, based on the data. The controller 360 may include a power supply (not shown) that independently powers the various lamps or lamp zones. The controller 360 can be configured with a desired temperature profile, and based on comparing the data received from the sensors 170; the controller 360 adjusts power to lamps and/or lamp zones to conform the observed thermal data to the desired temperature profile. The controller 360 may also adjust power to the lamps and/or lamp zones to conform the thermal treatment of one substrate to the thermal treatment of another substrate, in the event some chamber characteristics drift over time.

Figure 4:
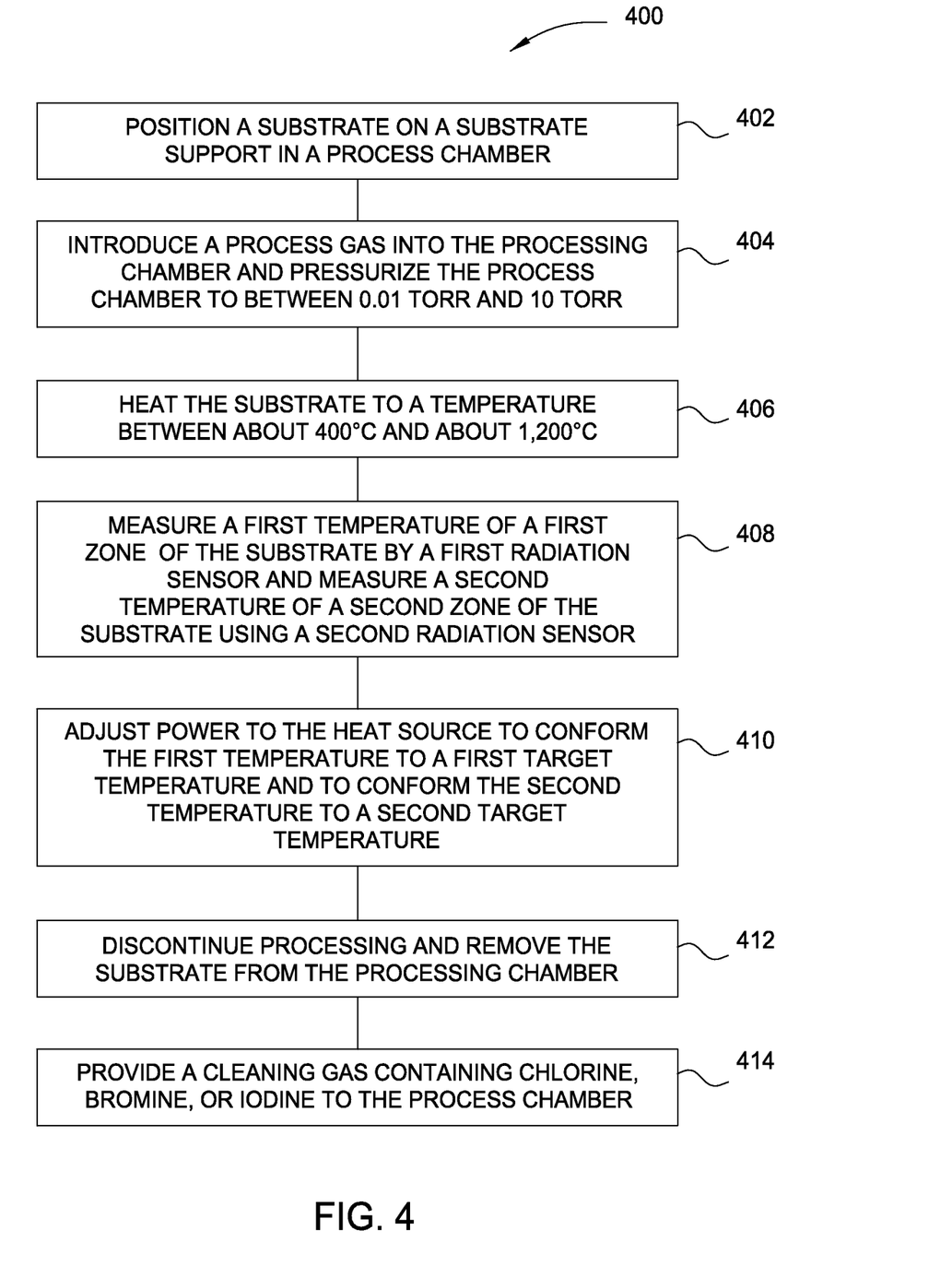
FIG. 4 is a flow diagram illustrating a method according to some implementations described herein.

FIG. 4 is a flow diagram illustrating a method according to implementations described herein. FIG. 4 is a flow diagram summarizing a method 400 according to another implementation. At block 402, a substrate is positioned on a substrate support in a process chamber. Exemplary process chambers are described in FIG. 1, FIG. 2 and FIG. 3. The substrate support is substantially transparent to thermal radiation and has low thermal mass. Thermal lamps are positioned to provide heat to the substrate. The thermal lamps may be positioned either above the substrate support or below the substrate support.

At block 404, a process gas is introduced to the process chamber. The pressure of the process chamber may be set between about 0.01 Torr and about 10 Torr. The process gas may be any gas from which a layer is to be formed on the substrate. The process gas may contain a group IV precursor and/or group III and group V precursors, from which a group IV material, such as silicon or germanium, or a group III/V compound material, such as aluminum nitride, may be formed. Mixtures of such precursors may also be used. The process gas may be flowed with an unreactive diluent or carrier gas, and may be provided in laminar or quasi-laminar flow substantially parallel to the substrate surface.

At block 406, the substrate may be heated to a temperature between about 400° C. and about 1,200° C., for example about 600° C. The substrate may be heated by heating source (e.g., a plurality of lamps as described above). The precursors contact the heated substrate surface and form a layer on the substrate surface. The substrate may be rotated to improve uniformity of film properties.

At block 408, a first temperature of a first zone of the substrate is measured by a first radiation sensor and a second temperature of a second zone of the substrate is measured by a second radiation sensor. The radiation sensors are used in conjunction with the radiation sources and optional reflective members described herein. In some implementations, the signals received from the radiation sensors may be adjusted to compensate for background radiation emanating from the lamps and reflected from the substrate. The substrate optical properties as a function of temperature, along with the known intensity of light emitted by the lamps, may be used to model the intensity of reflected light, and the modeled intensity used to adjust the signals from the radiation sensors to improve the signal to noise ratio of the sensors. In some implementations, another technique to compensate for extraneous radiation received by the radiation sensor is to chop or pulse the radiation source 140 at a frequency different from the heating sources and use filtering electronics (e.g., a lock-in amplifier and/or software) to separate the pulsed signal from the background radiation.

At block 410, power to the heat source is adjusted based on the first temperature and the second temperature readings to conform the first temperature to a first target temperature and to conform the second temperature to a second target temperature. The first and second target temperatures may be the same or different. For example, to compensate for faster film formation at an edge of the substrate than at the center of the substrate, the first temperature may be measured at the center of the substrate, the second temperature may be measured at the edge of the substrate, and lamp power adjusted to provide a higher substrate temperature at the center than at the edge of the substrate. More than two zones may be used to monitor temperatures at more than two locations on the substrate to increase the specificity of local temperature control, if desired.

At block 412, processing is stopped and the substrate is removed from the process chamber. At block 414, a cleaning gas is provided to the chamber to remove deposits from chamber surfaces. Removing the deposits corrects reduction in transmissivity of chamber components to lamp radiation and to substrate emissions, maintaining repeatability of film properties from substrate to substrate. The cleaning gas is typically a gas containing chlorine, bromine, or iodine. Gases such as $Cl_2$, $Br_2$, $I_2$, HCl, HBr, and HI are often used. When elemental halogens are used, temperature of the chamber may be held approximately constant, or increased slightly, to clean the chamber. When hydrogen halides are used, temperature of the chamber is typically increased to compensate for reduced concentration of halogen cleaning agents. Temperature of the chamber during cleaning with hydrogen halides may be increased to between about 800° C. and about 1,200° C., for example about 900° C. After cleaning from 30 seconds to 10 minutes, depending on the desired cleaning result, another substrate may be processed.

While the foregoing is directed to implementations of the present disclosure, other and further implementations of the disclosure may be devised without departing from the basic scope thereof, and the scope thereof is determined by the claims that follow.

The invention claimed is:

1. A substrate processing apparatus, comprising:
a vacuum chamber comprising:
  a sidewall defining a processing region having a substrate support disposed therein and operable to support a substrate in a horizontal orientation;
  a plurality of thermal lamps positioned external to the processing region and below the substrate support;
  a first window positioned between the plurality of thermal lamps and the processing region;
  a radiation source disposed within the sidewall and operable to direct emitted radiation along a first path toward an area proximate the plurality of lamps and below the substrate support;
  a radiation sensor disposed above the substrate support opposite the plurality of thermal lamps and operable to receive the emitted radiation from the radiation source; and
  a reflector positioned at an end of the first path between the plurality of thermal lamps and the substrate support and operable to receive the emitted radiation from the radiation source and direct the emitted radiation from the radiation source disposed within the sidewall along a second path through the substrate and toward the radiation sensor;
a plurality of power supplies coupled with the plurality of thermal lamps; and
a controller that adjusts the plurality of power supplies based on input from the radiation sensor.

2. The substrate processing apparatus of claim 1, wherein the reflector is positioned adjacent to the first window.

3. The substrate processing apparatus of claim 2, wherein the reflector is sized to fit between adjacent thermal lamps of the plurality of thermal lamps.

4. The substrate processing apparatus of claim 1, wherein the reflector is embedded in the first window.

5. The substrate processing apparatus of claim 1, wherein the radiation source disposed within the sidewall is positioned behind a second window.

6. The substrate processing apparatus of claim 1, wherein the reflector is positioned between two pieces of sealed quartz.

7. The substrate processing apparatus of claim 1, wherein the reflector is a back surface coated mirror with a protective layer disposed thereon.

8. The substrate processing apparatus of claim 1, wherein the first window is quartz.

9. The substrate processing apparatus of claim 1, wherein the first window is positioned below the sidewall and the plurality of thermal lamps are positioned below the first window.

10. The substrate processing apparatus of claim 1, wherein the first window is a transparent dome.

11. A substrate processing apparatus, comprising:
a vacuum chamber comprising an upper transparent dome, a lower transparent dome, and a sidewall positioned between the upper transparent dome and the lower transparent dome;
a plurality of thermal lamps positioned below the lower transparent dome;
a substrate support positioned within the vacuum chamber and operable to support a substrate in a horizontal orientation;
a radiation source disposed within the sidewall and operable to direct emitted radiation along a first path toward an area proximate the plurality of lamps and below the substrate support;
a radiation sensor disposed above the substrate support opposite the plurality of thermal lamps and operable to receive the emitted radiation from the radiation source;
a reflector positioned at an end of the first path between the plurality of thermal lamps and the substrate support and operable to receive the emitted radiation from the radiation source and direct the emitted radiation from the radiation source disposed within the sidewall along a second path through the substrate toward the radiation sensor;

a plurality of power supplies coupled with the plurality of thermal lamps in relation to a position of the radiation sensor; and a controller that adjusts the plurality of power supplies based on input from the radiation sensor.

12. The substrate processing apparatus of claim 11, wherein the reflector is positioned adjacent to the lower transparent dome.

13. The substrate processing apparatus of claim 11, wherein the reflector is embedded in the lower transparent dome.

14. The substrate processing apparatus of claim 11, wherein the reflector is sized to fit between adjacent thermal lamps of the plurality of thermal lamps.

15. The substrate processing apparatus of claim 11, wherein the radiation source disposed within the sidewall is positioned behind a window.

16. The substrate processing apparatus of claim 11, wherein the reflector is positioned between two pieces of sealed quartz.

17. The substrate processing apparatus of claim 11, wherein the reflector is a back surface coated mirror with a protective layer disposed thereon.

18. The substrate processing apparatus of claim 11, wherein the lower transparent dome is quartz.

* * * * *